(12) United States Patent
Kronmueller

(10) Patent No.: US 7,161,431 B2
(45) Date of Patent: Jan. 9, 2007

(54) CLASS B AMPLIFIER WITH PROCESS VARIATION INDEPENDENT DEADBAND

(75) Inventor: Frank Kronmueller, Neudenau (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 117 days.

(21) Appl. No.: 10/983,063

(22) Filed: Nov. 5, 2004

(65) Prior Publication Data

US 2006/0091953 A1    May 4, 2006

(30) Foreign Application Priority Data

Nov. 3, 2004    (EP)    ................................ 04368069

(51) Int. Cl.
 *H03F 3/45* (2006.01)
(52) U.S. Cl. ........................ 330/255; 330/257; 330/269
(58) Field of Classification Search ..................... None
See application file for complete search history.

(56) References Cited

U.S. PATENT DOCUMENTS

| 3,229,217 | A |  | 1/1966 | Van Zeeland |  |
|---|---|---|---|---|---|
| 3,450,973 | A |  | 6/1969 | Tobez |  |
| 3,568,081 | A |  | 3/1971 | Pinckaers | 330/30 |
| 3,699,464 | A |  | 10/1972 | Zobel | 330/12 |
| 3,821,625 | A |  | 6/1974 | Scholl | 318/624 |
| 3,825,852 | A |  | 7/1974 | Pinckaers | 330/30 D |
| 4,061,932 | A |  | 12/1977 | Cordell | 307/360 |
| 4,335,358 | A |  | 6/1982 | Hoeft | 330/255 |
| 4,337,423 | A |  | 6/1982 | Giordano | 318/280 |
| 4,588,960 | A |  | 5/1986 | Salama et al. | 330/264 |
| 6,414,552 | B1 | * | 7/2002 | Kronmueller et al. | 330/255 |
| 6,710,660 | B1 |  | 3/2004 | Shacter | 330/255 |
| 6,879,212 | B1 | * | 4/2005 | Suzuki | 330/255 |
| 2003/0155966 | A1 |  | 8/2003 | Harrison | 330/9 |
| 2003/0218482 | A1 |  | 11/2003 | Ivanov et al. | 327/134 |

\* cited by examiner

*Primary Examiner*—Khanh Van Nguyen
(74) *Attorney, Agent, or Firm*—Saile Ackerman LLC; Stephen B. Ackerman

(57) ABSTRACT

A class B amplifier circuit produces a deadband that is independent of semiconductor process variations and creates a positive voltage when a differential input voltage is non-zero. A differential input amplifier couples differential currents representing the differential input voltage to a logarithmic compression circuit, which in turn creates an output voltage that is a function of the differential input voltage and is independent of semiconductor process variations. Transistor devices in the differential amplifier and the logarithmic compression circuit are biased in the non-saturated region of a transistor transfer curve in a weak inversion state. A combination of two comparator circuits compares the output voltage to a reference voltage to create a combined output voltage that is a positive when the input is non-zero.

28 Claims, 4 Drawing Sheets

CLASS B AMPLIFIER WITH PROCESS VARIATION INDEPENDENT DEADBAND

BACKGROUND OF THE INVENTION

1. Field of Invention

The present invention relates to class B amplifiers and more specifically to a class B amplifier with a process variation independent deadband.

2. Description of Related Art

A class B amplifier with a differential input produces a deadband at its output that is a result of the input signal at zero volts. The deadband produces a distortion at the output, and control of the deadband to eliminate the distortion effect has been semiconductor process dependent, which causes a widening of the deadband to allow for process variations. This allowance for process variations makes the deadband be wider than it could otherwise be and can extend over a wide range of the input signal causing a substantial distortion in the output signal.

Class B amplifiers are useful for low power applications, where the input signal is a differential signal and the output is used to control a device such as a motor. In this case a wide deadband prevents optimum control of the motor in and around the crossover between a positive and negative input signal. Reducing the width of the deadband is critical to good motor control in and around a zero input signal of a class B amplifier.

In U.S. Pat. No. 6,710,660 (Shacter) a deadband amplifier design is directed to a class B power amplifier with rail-to-rail output swing and a small deadband. U.S. Pat. No. 4,588,960 (Salama et al.) is directed to a class B amplifier used for low voltage and low power integrated circuit applications. U.S. Pat. No. 3,821,625 (Scholl) is directed to an amplifier design where a second stage has a high gain and output signal to compensate for a deadband in the output signal. U.S. Pat. No. 3,699,464 (Zobel) is directed to an amplifier with a deadband in which the common mode range is widened, allowing the deadband to be adjusted by adjusting current sources coupled to the output stage.

A need exists to create a class B amplifier for use in integrated circuits that has a well-defined narrow deadband that is independent of semiconductor process variations, and providing a positive voltage for a non-zero input signal. This would provide an improved control of subsequent stages for input signals in and around the crossover between a negative and positive input signal.

SUMMARY OF THE INVENTION

It is an objective of the present invention to produce a narrow deadband in a class B amplifier that is independent of semiconductor process variations.

It is also an objective of the present invention to generate currents in the input stage of the class B amplifier and couple the currents to the output stage using a current mirror.

It is further an objective of the present invention to develop an output from a second stage of the class B amplifier, which produces a positive voltage for a non-zero input signal.

It is still further an objective of the present invention to bias CMOS transistors contained within the input and output stages of the class B amplifier in a weak inversion state.

It is also further an objective of the present invention to reference two comparator circuits contained in the output stage to a reference voltage that allows a first comparator to produce a positive voltage for a positive differential input signal, a second comparator to produce a positive voltage for a negative differential input signal, and a zero voltage produced by both comparators when the input differential signal is zero volts.

In the present invention a class B amplifier produces a narrow deadband independent of semiconductor process variations. An input circuit comprising a differential amplifier couples currents proportional to a differential input signal to an output circuit using a current mirror circuit. The output circuit contains two portions, where a first portion produces an output voltage when the differential input signal is greater than zero volts and the second portion producers an output voltage when the differential input signal is less than zero volts. Both portions produce a zero output voltage when the differential input signal is zero. CMOS transistors in the input circuit and the output circuit are biased in the active region at a weak inversion state of the channel charge profile to allow a process variation independent deadband.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
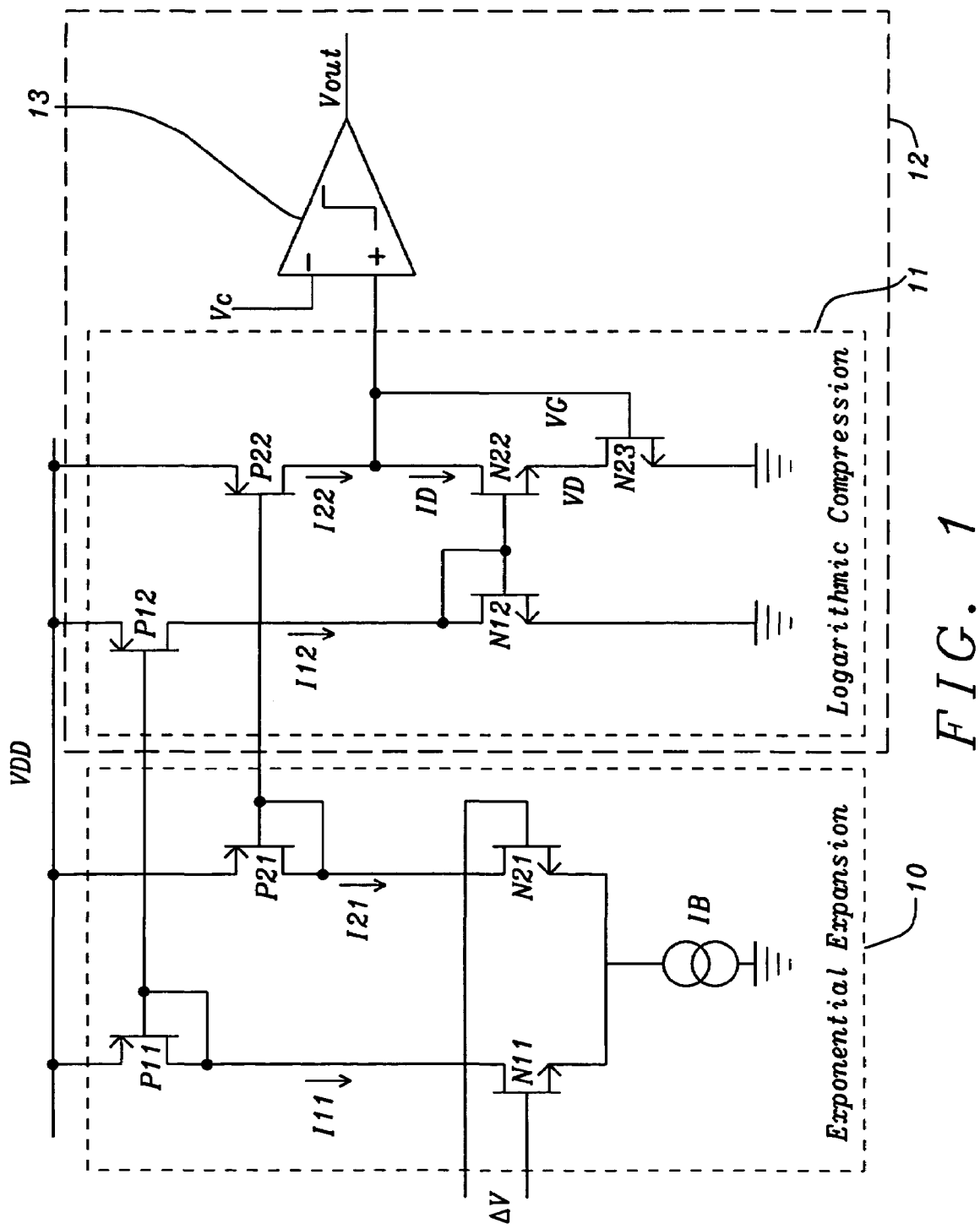
FIG. 1 is a circuit diagram of the present invention of a class B amplifier.

FIG. 1 shows a schematic diagram of the present invention. A differential input signal, $\Delta V$ is connected to a differential amplifier comprising CMOS transistor devices N11 and N21, which are biased in a weak inversion state and form an exponential expansion circuit 10 that receives the input signal $\Delta V$. The differential amplifier creates currents $I_{11}$ and $I_{22}$, which are sourced from the current generator $I_B$. The currents $I_{11}$ and $I_{12}$ are a function of $\Delta V$, where $$I12 = \frac{IB}{1 + e^{\frac{\Delta V}{nVt}}}; I21 = IB - I12; Vt = \frac{KT}{q}; \text{ and } n \approx 1.3$$

in which n is CMOS specific.

A current mirror, comprising transistors P11, P21, P12 and P 22, couple the currents $I_{11}$ and $I_{21}$ to a logarithmic compression circuit 11 contained within the output circuit 12. Current $I_{12}$ is the current mirror of $I_{11}$, and current $I_{22}$ is the current mirror of $I_{21}$. The logarithmic compression circuit 11 comprises CMOS transistors N12, N22 and N23. Transistor N22 creates a voltage $V_D$ that is related to the value of differential input signal $\Delta V$. Transistor N23 measures $I_D$ and $V_D$ and sets $V_G$, which is proportional to the input signal $\Delta V$. When the input signal $\Delta V$ makes a transition from a negative $\Delta V$ to a positive $\Delta V$, the voltage $V_G$ is boosted with gain from approximately Vth to a voltage greater than $V_C$. The voltage $V_G$ is coupled to a comparator circuit 13, and the comparator circuit 13 compares $V_G$ to a reference voltage $V_C$ to produce an output voltage Vout that is either zero or a positive voltage.

The CMOS transistor devices N12 and N22 are biased to be in a weak inversion state, and the voltage $$V_D = Vt \times \ln(m) - \frac{\Delta V}{n}, \text{ where } Vt = \frac{KT}{q}; m = \frac{(W/L)_{22}}{(W/L)_{12}} \text{ and } n \approx 1.3.$$

Figure 2A:
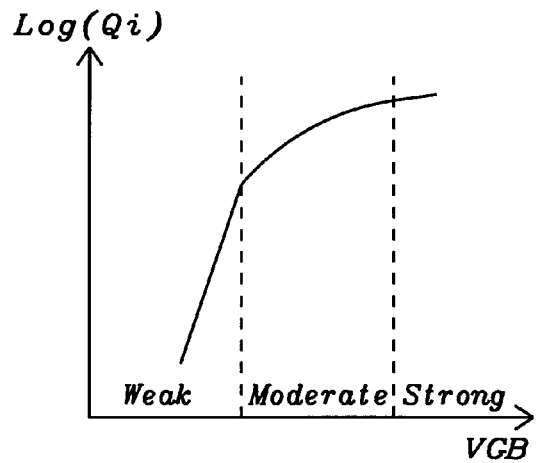
FIG. 2A is a graph of the present invention showing weak, moderate and strong inversion in the channel of a CMOS transistor.
Figure 2B:
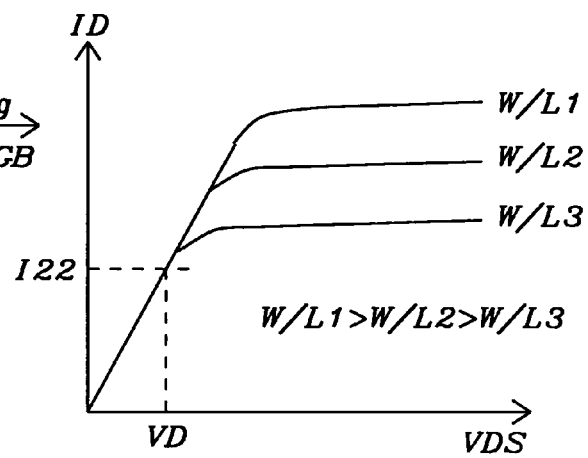
FIG. 2B is a graph of the present invention for the transfer characteristics of a CMOS transistor of the present invention as a function of channel width and length.

The term $(W/L)_{22}$ is the width to length ratio of the channel of transistor device N22, and the term $(W/L)_{21}$ is the width to length ratio for transistor device N21. Transistor device N23 measures $V_D$ and $I_D$ and sets the gate voltage $V_G$ to a value that represents the input voltage $\Delta V$. FIG. 2A shows weak, moderate and strong inversion on a graph of Log(Q) versus $V_{GB}$. Weak inversion, which is used an operating state of transistors N11, N21, N12 and N22, is the region where the charge Q is an exponential function of the gate voltage. Strong inversion is where the charge Q is a linear function of the gate voltage and moderate inversion is where Q is in a transition region between weak and strong inversion. FIG. 2B shows the operating point on the transfer curve for transistor device N23 formed by $I_D = I_{22}$ and $V_D$, where W/L1, W/L2 and W/L3 are different width to length ratios for transistor device N23. Transistor device N23 operates in the linear region since $V_D$ is typically 5 mV to 80 mV, where $I_{22} = I_D$ and $V_D$ define an operating point on the $I_D$ and $V_{DS}$ transfer curve of FIG. 2B.

Figure 3A:
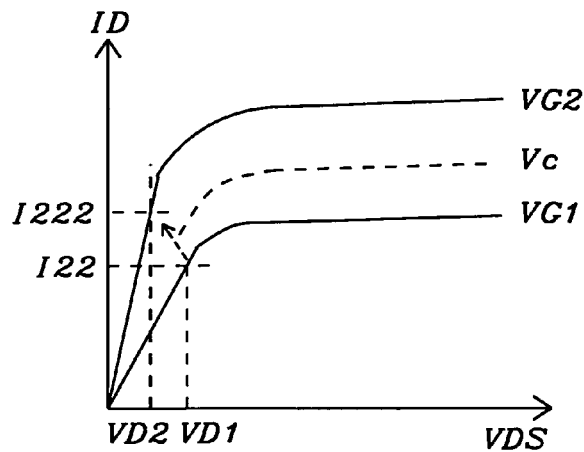
FIG. 3A is a graph of the present invention showing the change in operating states of a transistor in the output circuit.
Figure 3B:
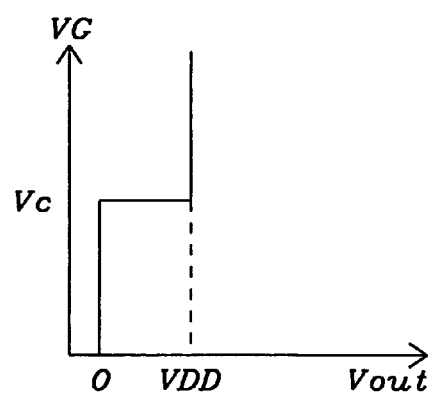
FIG. 3B is a graph of the present invention showing the output voltage of the comparator circuit as a result of the differential input signal changing state.

In FIG. 3A is shown the operating points for transistor device N23 as the input voltage $\Delta V$ goes from a negative differential signal where $I_D = I_{222}$, and $V_D = V_{D1}$ to a positive differential signal where $I_D = I_{222}$ and $V_D = V_{D2}$. When the differential input voltage $\Delta V$ is negative, the gate voltage of transistor device N23 is located on the gate voltage curve $V_G = V_{G1}$. When the differential input voltage goes positive, the new operating point is located on the gate voltage curve $V_G = V_{G2}$. The line representing $V_C$, which falls between $V_{G1}$ and $V_{G2}$, represents the reference voltage that is coupled to the comparator 13 (FIG. 1). When $\Delta V$ goes from a negative value ($V_D = V_{D1}$) to a positive value ($V_D = V_{D2}$), the reference voltage $V_G = V_C$ is crossed and the comparator 13 changes the output voltage from Vout=0 to Vout=$V_{DD}$ as shown in FIG. 3B.

Figure 4A:
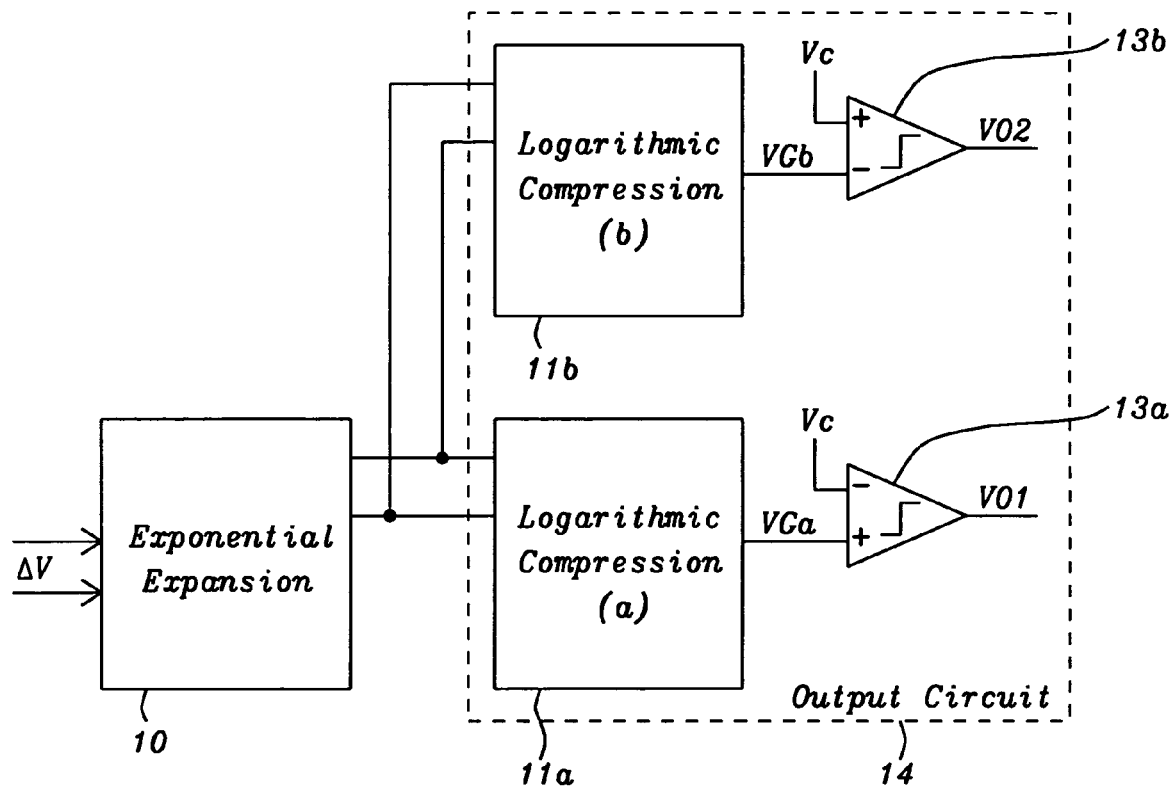
FIG. 4A is a block diagram of the class B amplifier of the present invention.

In FIG. 4A is shown a block diagram of the circuit of the present invention. A differential input voltage $\Delta V$ is coupled to the exponential expansion circuit 10. The exponential expansion circuit 10 couples current signals by means of a current mirror to both the logarithmic compression circuit (a) 11a and the logarithmic compression circuit (b) 11b, similar to that described in FIG. 1. The current mirror connections between the exponential expansion circuit 10 and the logarithmic compression circuit (b) 11b are reversed from the current mirror connection between the exponential expansion circuit 10 and the logarithmic compression circuit (a) 11a. In logarithmic compression circuit (a) 11a, current $I_{12}$ is the current mirror of $I_{11}$, and current $I_{22}$ is the current mirror of $I_{21}$ (as shown in FIG. 1). In logarithmic compression circuit (b) 11b, current $I_{12}$ is the current mirror of $I_{21}$, and current $I_{22}$ is the current mirror of $I_{11}$.

Continuing to refer to FIG. 4A, the reversing of the current mirror connections allows the logarithmic compression circuit (b) 11b to operate in the similar fashion for negative $\Delta V$ as the logarithmic compression circuit (a) 11a operates for positive $\Delta V$ and to provide a gain boost to $V_{Gb}$ from approximately Vth to a voltage greater than the reference voltage $V_C$ when $\Delta V$ makes the transition from a negative differential voltage to a positive differential voltage. The inputs of the comparator 13b connected to logarithmic compression circuit (b) 11b are reversed with respect to comparator 13a connected to logarithmic compression circuit (a) 11a such that $V_{O2}$ is positive for negative input signal $\Delta V$ compared to $V_{O1}$, which is 0V for a negative input signal $\Delta V$.

Continuing to refer to FIG. 4A, both logarithmic compression circuits 11a and 11b operate the same and produce the same gate voltage $V_{Ga} = V_{Gb}$. The voltage $V_{Ga}$ is coupled to comparator 13a and produces an output voltage $V_{O1} = 0$ when $\Delta V$ is negative and $V_{O1}$=(a positive voltage) when $\Delta V$ is positive. In like manner, the voltage $V_{Gb}$ is coupled to comparator 13b and produces an output voltage $V_{O2} = 0$ when $\Delta V$ is positive and $V_{O2}$=(a positive voltage) when $\Delta V$ is negative as shown in FIG. 4B.

Figure 4B:
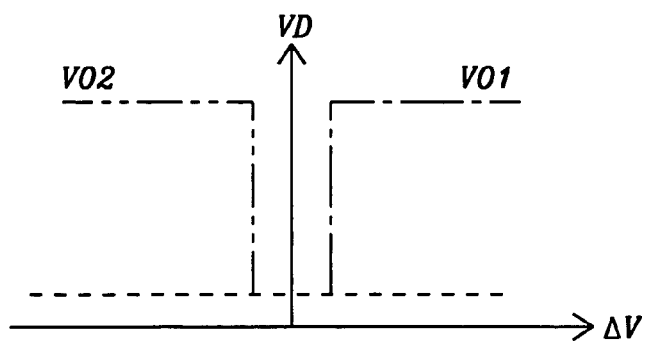
FIG. 4B is a diagram of the output voltages of the class B amplifier of the present invention.

In FIG. 4B the output $V_{O2}$ is a positive voltage when the differential input voltage $\Delta V$ is negative, and goes to zero volts when $\Delta V$ approaches zero. Conversely, the output voltage $V_{O1}$ of comparator 13a is zero volts and goes to a positive voltage when the differential input voltage $\Delta V$ becomes positive. The combination of $V_{O1}$ and $V_{O2}$ produce a small deadband, and because N12 and N22 are biased in a weak inversion state in the non-saturated region of the transfer curve, the deadband is independent of semiconductor process variations.

Figure 5:
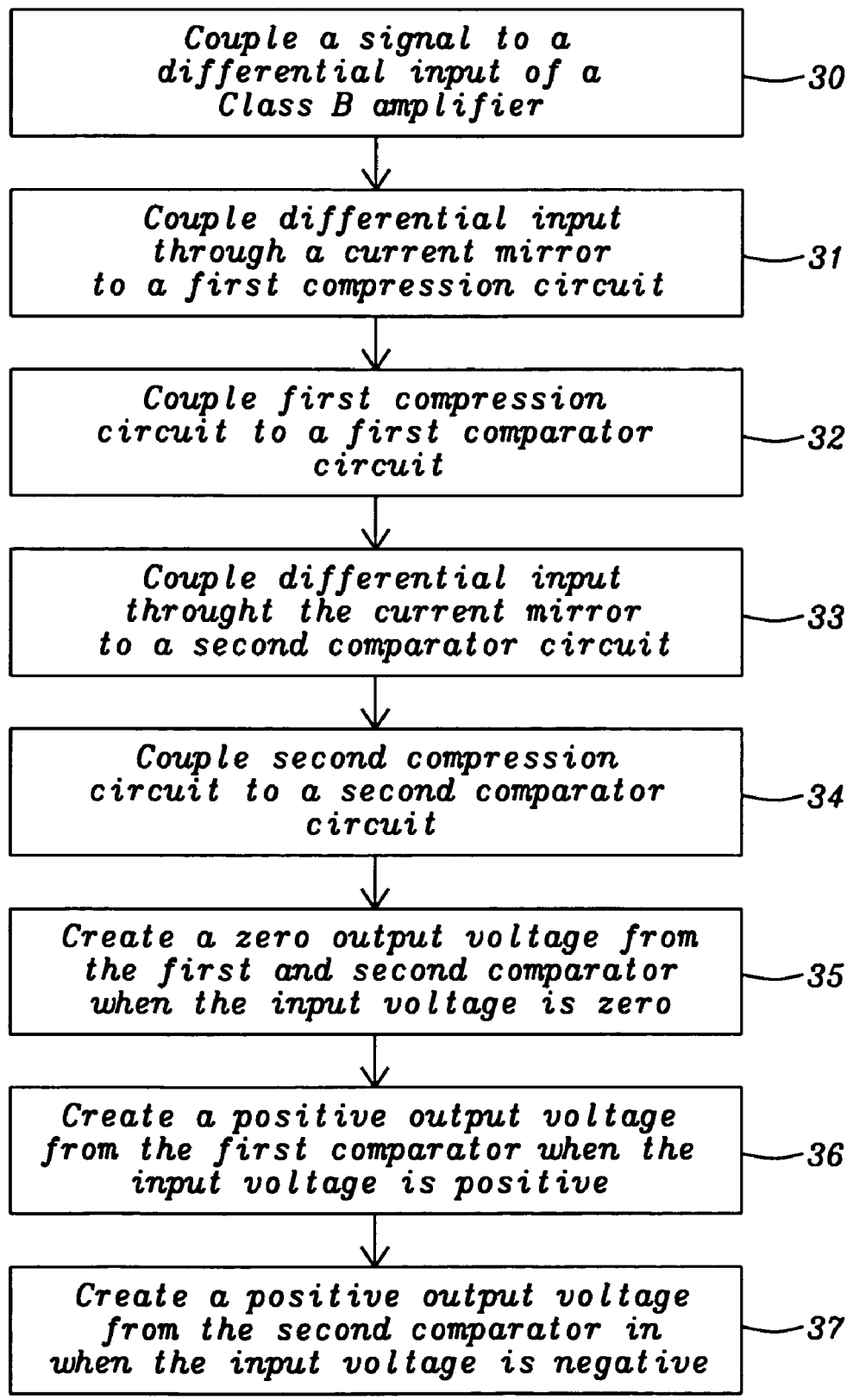
FIG. 5 is a flow diagram of the process to create a narrow deadband output from the lass B amplifier of the present invention.

In FIG. 5 is shown a method of producing a small deadband that is independent of semiconductor process variations. A differential signal is coupled to the input of a differential amplifier 30. The transistors of the differential amplifier are biased in a weak inversion state and therefore, operate as an exponential expansion circuit. The resulting differential currents of the differential amplifier are coupled to a first logarithmic compression circuit using a current mirror circuit 31. The output of the first logarithmic compression circuit is coupled to a first comparator circuit 32 that compares the output of the first logarithmic compression circuit to a reference voltage. The reference voltage and the output from the first logarithmic compression circuit are connected to the first comparator such that the first comparator produces a positive voltage when the differential input signal is positive 36 and a voltage of zero volts when the input signal is either zero volts 35 or a negative voltage. The differential currents of the differential amplifier are coupled to a second logarithmic compression circuit using a current mirror circuit 33. The output of the second logarithmic compression circuit is coupled to a second comparator circuit 34 that compares the output of the second logarithmic compression circuit to the reference voltage. The reference voltage and the output from the second logarithmic compression circuit are connected to the second comparator such that the second comparator produces a positive voltage when the differential input signal is a negative voltage 37 and a voltage of zero volts when the input signal is either zero volts 35 or a positive voltage.

While the invention has been particularly shown and described with reference to preferred embodiments thereof, it will be understood by those skilled in the art that various changes in form and details may be made without departing from the spirit and scope of the invention.

What is claimed is:

1. A class B circuit with a process variation independent deadband, comprising:
   a) a differential input circuit receiving a differential input signal,
   b) an output circuit,
   c) said differential input circuit receives said differential input signal and couples said differential input signal to said output circuit, wherefrom said output circuit creates an output voltage greater than zero volts for said differential input signal less than zero volts, said output circuit creates an output voltage equal to zero volts for said differential input signal equal to zero volts, and said output circuit creates said output voltage greater than zero volts for said differential input signal greater than zero volts.

2. The circuit of claim 1, wherein said differential input circuit creates differential currents that are a function of said differential input signal and couples the differential currents to the output circuit by a current mirror circuit.

3. The circuit of claim 1, wherein said differential input circuit further comprises CMOS transistors in a state of weak inversion.

4. The circuit of claim 3, wherein said CMOS transistors are created with a channel width and a channel length that defines an operating point on said transistor transfer curve.

5. The circuit of claim 1, wherein said differential input circuit is an exponential expansion circuit operating in a non-saturated region of a current-voltage transfer curve.

6. The circuit of claim 1, wherein said output circuit is a logarithmic compression circuit operating in a non-saturated region of a current-voltage transfer curve and coupled to a comparator circuit.

7. The circuit of claim 6, wherein said output circuit produces an output signal that is independent of semiconductor process variations.

8. The circuit of claim 1, wherein said output circuit further comprises two portions coupled to the differential input circuit through a current mirror circuit whereby a first portion of said two portions creates said output voltage greater than zero for said differential input signal greater than zero volts, a second portion of said two portions creates said output voltage greater than zero for said differential input signal less than zero volts, and both the first and second portions create said output voltage equal to zero volts for said differential input signal equal to zero volts.

9. The circuit of claim 8, wherein each of said two portions further comprises:
   a) a compression circuit,
   b) a comparator circuit,
   c) a reference voltage,
   d) said comparator circuit coupled to said compression circuit,
   e) said compression circuit biased at an operating point in a linear region of a transistor transfer curve,
   f) an output voltage of said comparator changes when said differential input signal forces said operating point past the reference voltage.

10. The circuit of claim 9, wherein said compression circuit further comprises CMOS transistors biased in a state of weak inversion.

11. The circuit of claim 10, wherein said CMOS transistors are created with a channel width and a channel length that defines an operating point of said transistors.

12. The circuit of claim 9, wherein said compression circuit produces a circuit voltage independent of semiconductor process variations and that is a function of said differential input signal.

13. The circuit of claim 12, wherein said circuit voltage is compared to said reference voltage in said comparator circuit to produce said output voltage of the comparator circuit that is positive when said differential input signal is not zero.

14. A method for producing a process independent deadband in a class B amplifier, comprising;
   a) coupling a differential input signal to an input stage of a class B amplifier,
   b) coupling an output of said input stage to a first compression circuit,
   c) coupling output of said input stage to a second compression circuit,
   d) coupling an output of said first compression circuit to a first comparator,
   e) coupling an output of said second compression circuit to a second comparator,
   f) producing a zero volts at the output of said first and second comparators when said differential input signal is zero volts,
   g) producing a positive voltage at the output of said first comparator when the differential input signal is positive,
   g) producing a positive voltage at the output of said second comparator when the differential input signal is negative.

15. The method of claim 14, wherein said input stage further comprises CMOS transistors biased in a weak inversion state.

16. The method of claim 14, wherein said output of the input stage is a differential current that is a function of said differential input signal.

17. The method of claim 16, wherein coupling said output of the input stage to the first compression circuit uses a current mirror circuit.

18. The method of claim 17, wherein coupling said output of the input stage to the second compression circuit uses said current mirror circuit.

19. The method of claim 14, wherein said first compression circuit further comprises CMOS transistors biased in a weak inversion state.

20. The method of claim 19, wherein said second compression circuit further comprises CMOS transistors biased in said weak inversion state.

21. The method of claim 20, wherein said first and second compression circuits each produce a voltage independent of semiconductor process variations that is a function of said differential input signal.

22. The method of claim 21, wherein said voltage of the first compression circuit is compared to a reference voltage in said first comparator circuit to produce a positive first comparator output voltage when said differential input signal is positive.

23. The method of claim 21, wherein said voltage of the second compression circuit is compared to said reference voltage in said second comparator circuit to produce a positive second comparator output voltage when said differential input signal is negative.

24. A circuit for producing a process variation independent deadband, comprising:
   a) a means for translating a differential input voltage into differential currents,
   b) a means for coupling said differential currents to a compression circuit means that produces a compression circuit voltage that is a function of said differential input voltage,
   c) a means for comparing said compression circuit voltage to a reference voltage to produce an output voltage that is positive when said differential input voltage is non-zero.

25. The circuit of claim 24, wherein said means for translating said differential input voltage into differential currents is a differential input circuit biased in a weak inversion state.

26. The circuit of claim 24, wherein said means for coupling said differential currents is a current mirror circuit.

27. The circuit of claim 24, wherein said compression circuit means further comprises CMOS transistors biased in a weak inversion state.

28. The circuit of claim 24, wherein said means for comparing produces said output voltage of zero volts when said differential input voltage is zero.

* * * * *